United States Patent
Bauer et al.

(10) Patent No.: US 8,354,299 B2
(45) Date of Patent: Jan. 15, 2013

(54) SEMICONDUCTOR COMPONENT HAVING A STACK OF SEMICONDUCTOR CHIPS AND METHOD FOR PRODUCING THE SAME

(75) Inventors: Michael Bauer, Nittendorf (DE); Thomas Engling, Koenigsbronn (DE); Alfred Haimerl, Sinzing (DE); Angela Kessler, Regensburg (DE); Joachim Mahler, Regensburg (DE); Wolfgang Schober, Amberg (DE)

(73) Assignee: Infineon Technologies AG, Neubiberg (DE)

( * ) Notice: Subject to any disclaimer, the term of this patent is extended or adjusted under 35 U.S.C. 154(b) by 1182 days.

(21) Appl. No.: 10/598,143

(22) PCT Filed: Feb. 9, 2005

(86) PCT No.: PCT/DE2005/000215
§ 371 (c)(1),
(2), (4) Date: Nov. 18, 2009

(87) PCT Pub. No.: WO2005/081315
PCT Pub. Date: Sep. 1, 2005

(65) Prior Publication Data
US 2010/0207277 A1    Aug. 19, 2010

(30) Foreign Application Priority Data
Feb. 18, 2004  (DE) .................. 10 2004 008 135

(51) Int. Cl.
*H01L 21/44* (2006.01)
(52) U.S. Cl. .. 438/109; 257/686; 257/777; 257/E25.013

(58) Field of Classification Search .................. 257/777, 257/686, E25.013; 438/618, 666, 612, 109
See application file for complete search history.

(56) References Cited

U.S. PATENT DOCUMENTS

| | | | |
|---|---|---|---|
| 5,637,536 A | 6/1997 | Val | |
| 5,837,566 A * | 11/1998 | Pedersen et al. | 438/109 |
| 5,847,448 A * | 12/1998 | Val et al. | 257/686 |
| 7,060,526 B2 * | 6/2006 | Farnworth et al. | 438/106 |
| 2002/0096760 A1 | 7/2002 | Simelgor et al. | |
| 2002/0105789 A1 * | 8/2002 | Chen et al. | 361/767 |
| 2003/0006493 A1 | 1/2003 | Shimoishizaka et al. | |
| 2003/0038353 A1 * | 2/2003 | Derderian | 257/685 |
| 2003/0071341 A1 | 4/2003 | Jeung et al. | |

(Continued)

FOREIGN PATENT DOCUMENTS
DE    10200268    11/2002
(Continued)

OTHER PUBLICATIONS

Norland Materials Data Sheet, Feb. 1998.*

(Continued)

*Primary Examiner* — David Vu
(74) *Attorney, Agent, or Firm* — Dicke, Dillig & Czaja, PLLC

(57) ABSTRACT

A semiconductor component including a stack of semiconductor chips, the semiconductor chips being fixed cohesively one on top of another, is disclosed. The contact areas of the semiconductor chips are led as far as the edges of the semiconductor chips and conductor portions extend at least from an upper edge to a lower edge of the edge sides of the semiconductor chips in order to electrically connect the contact area of the stacked semiconductor chips to one another.

7 Claims, 3 Drawing Sheets

U.S. PATENT DOCUMENTS

| | | |
|---|---|---|
| 2003/0132527 A1 | 7/2003 | Coomer |
| 2003/0175411 A1 | 9/2003 | Kodas et al. |
| 2003/0218191 A1 | 11/2003 | Nordal et al. |
| 2003/0232460 A1* | 12/2003 | Poo et al. ............. 438/106 |
| 2004/0026007 A1* | 2/2004 | Hubert et al. ............. 156/64 |
| 2004/0140549 A1 | 7/2004 | Miyagawa |
| 2004/0155326 A1 | 8/2004 | Kanbayashi |

FOREIGN PATENT DOCUMENTS

| | | |
|---|---|---|
| JP | 2001210782 | 8/2001 |
| JP | 2002216661 A | 8/2002 |
| JP | 2003086762 | 3/2003 |
| WO | 9910925 A1 | 3/1999 |
| WO | 0169679 A1 | 9/2001 |
| WO | WO03084297 | 10/2003 |

OTHER PUBLICATIONS

Choi et al., A Photocurable Poly(dimethylsiloxane) Chemistry Designed for Soft Lithographic Molding and Printing in the Nanometer Regime, J. AM.Chem. Soc., vol. 125, pp. 4060-4061, 2003.*

* cited by examiner

# SEMICONDUCTOR COMPONENT HAVING A STACK OF SEMICONDUCTOR CHIPS AND METHOD FOR PRODUCING THE SAME

BACKGROUND

One embodiment of the invention relates to a semiconductor component having a stack of semiconductor chips and a method for producing the same, the semiconductor chips having contact areas which are electrically connected via conductor portions in the semiconductor chip stack.

The increasing densification particularly in hardware for data storage arrangements and data processing requires semiconductor modules that are as compact as possible in conjunction with minimal space requirement. One possibility is afforded by the stacking of semiconductor chips and/or semiconductor components to form a semiconductor module stack. However, there is an optimization problem in the fact that the components of a stacked semiconductor module have to be wired among one another in space-saving fashion. The wiring solutions known to date work with flip-chip contact connections and/or with bonding connections which have a considerable space requirement. Further connection techniques provide rewiring plates between the components to be stacked in order to solve the wiring of a chip stack, with the result that the space requirement is likewise high. What is more, conventional solutions impose boundary condition and size condition on the components to be stacked, which impedes a freely selectable wiring and the stacking of semiconductor chips of arbitrary area sizes to form semiconductor components.

For these and other reasons, there is a need for the present invention.

SUMMARY

The invention provides a semiconductor component having a stack of semiconductor chips, the semiconductor chips having different sizes and a reliable, space-saving electrical connection between the stacked semiconductor chips nevertheless being ensured.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
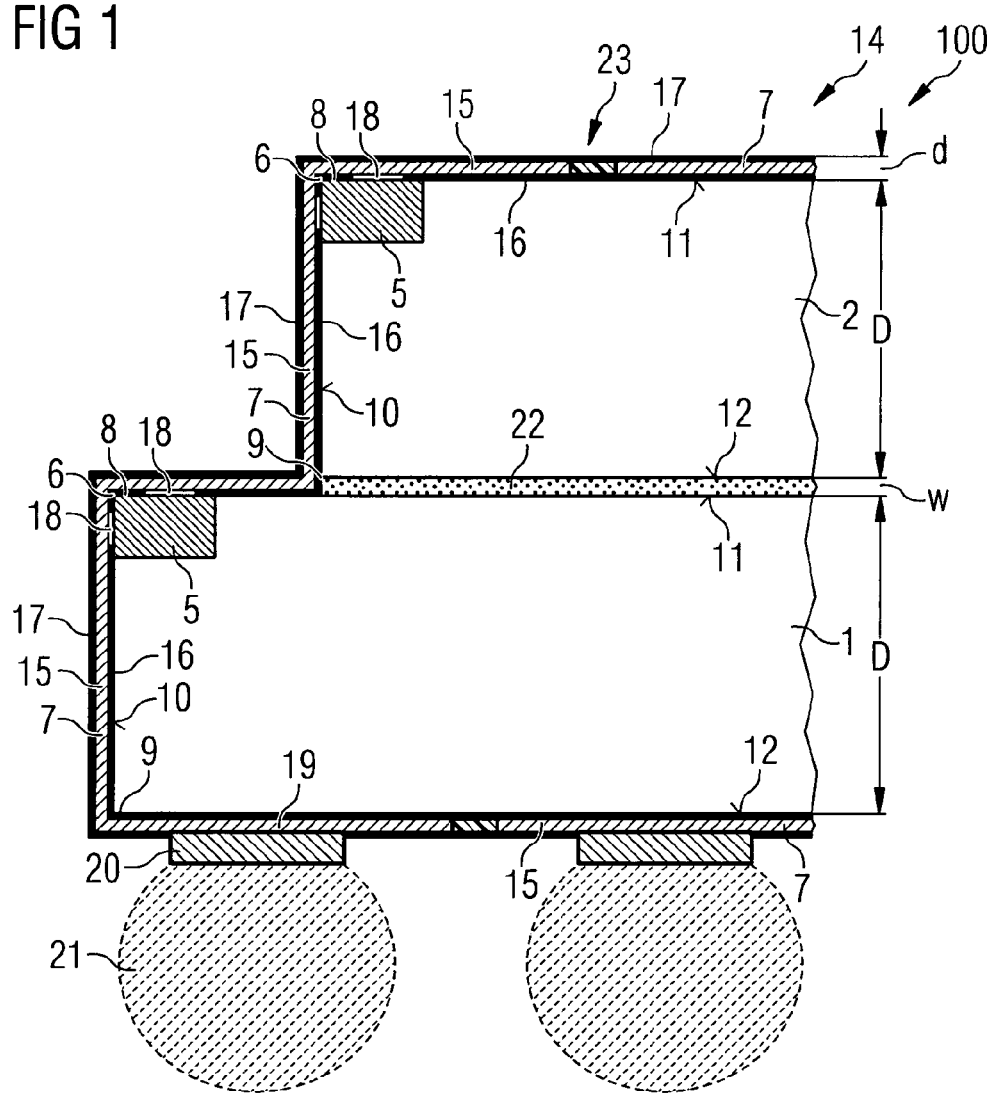
FIG. 1 illustrates a schematic cross section through a component having a semiconductor chip stack of a first embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention provides a semiconductor component having a stack of semiconductor chips, the semiconductor chips of the semiconductor chip stack being arranged in a manner fixed cohesively one on top of another. For this purpose, the semiconductor chips have contact areas extending as far as the edges of the semiconductor chips. In addition, conductor portions extend from at least one upper edge to a lower edge of the edge sides of the semiconductor chips, and they electrically connect the contact areas of the semiconductor chips of the semiconductor chip stack.

As a result of the cohesive connection between the semiconductor chips and of the stack, the space requirement is minimized to the thickness of the semiconductor chips, especially as cohesive, areal connections of this type between the semiconductor chips take up only a few micrometers. The thickness of the semiconductor chip stack can furthermore be reduced further by thinning the stacked semiconductor chips. By leading the contact areas on the active top side of the semiconductor chips as far as the edges of the respective semiconductor chip, it is ensured that the conductor portions arranged on the edge sides can produce a reliable electrical contact between the contact areas of an upper semiconductor chip and the contact areas of a semiconductor chip arranged underneath. For this purpose, the two contact areas to be connected do not have to be arranged directly one above the other, since the conductor portions on the edge sides of the semiconductor chips also enable structures in which the contact areas of an upper and of a lower semiconductor are arranged in a manner offset with respect to one another.

The conductor portions extending on the edge sides of the semiconductor chips do not limit the free selectability of the chip sizes that are to be connected to one another. Thus, in one embodiment of the invention, the semiconductor chips may have different chip sizes. In that case, the conductor portions which connect two contact areas of two chips having different area sizes to one another may be led on edge regions of the active top side of the semiconductor chips or on edge regions of the rear sides of the semiconductor chips in such a way that virtually any desired size differences may prevail between the semiconductor chips and are overcome by the line routing. A further advantage of this invention is that alternately large-area and small-area semiconductor chips may also be stacked one above another since the conductor portions can be led in any desired manner along the edge sides, the top sides and the rear sides of the semiconductor chips.

As a result of laying the contact areas to the edges of the semiconductor chips, it is possible to effect a wiring of this type on the edge sides of the semiconductor chips and thus on the edge sides of the semiconductor component in combination with wirings on non-covered active top sides and rear sides of the semiconductor chips. The flexibility of this line routing which is restricted to the edge sides of a semiconductor chip stack has the advantage over conventional solutions that the semiconductor chips can be adhesively bonded, soldered or diffusion-soldered one on top of another over the whole area, without taking into consideration any flip-chip contacts or contact pads or rewiring plates, in minimal space. As a result, stacks of semiconductor chips become possible in which crosstalk is minimized and the feedback of signals via parasitic inductances remains suppressed.

It is also possible for the semiconductor chips to have a different number of contact areas at their edges. A wiring plan which takes account of this different number of contact areas is then correspondingly provided.

In contrast to bonding wires or flip-chip contacts, the electrically conductive conductor portions are arranged adhesively on the semiconductor chip edges, the semiconductor edge sides, the semiconductor top sides and/or the semiconductor rear sides. The space saving is thus optimal since no bonding loops whatsoever or other distances as a result of flip-chip contacts, by way of example, enlarge the space requirement. Consequently, the semiconductor component according to the invention having a stack of semiconductor chips constitutes an extremely high densification that has not been achieved heretofore, particularly in hardware for data storage arrangements and data processing.

In order to achieve line routing of this type, the conductor portions have an adherent plastic resist which is filled with metallic nanoparticles and is electrically conductive as soon as the nanoparticles have welded or fused together to form conductor portions. For this purpose, the nanoparticle-filled plastic resist is soluble in a solvent and can be stripped away from the side edges, the top sides, the edge sides and the rear sides of the semiconductor chips at the locations at which conductor portions do not arise. In order to densify the nanoparticles to form conductor portions, it is possible to use laser writers which, by means of their laser beam, on the one hand densify and fuse together the nanoparticles and on the other hand vaporize the plastic resist.

Patterning is also possible photolithographically if the plastic resist has corresponding properties, but the interconnect with the plastic-embedded nanoparticles subsequently has to be separately treated again in order to fuse together the nanoparticles. Furthermore, instead of individual, monolayer interconnect sections on the edge sides of the stack it is also possible to provide multilayer rewiring layers in which nanoparticle-filled electrically conductive and patterned plastic resist layers and insulation layers arranged in between alternate on the edge sides of the semiconductor chips. It is thus possible to accommodate complex circuit patterns on the edge sides of the semiconductor chip stack which cannot be realized by means of conventional bonding wire technology or by means of conventional flip-chip technology.

A method for producing a semiconductor component having a stack of semiconductor chips has the following process.

Firstly, semiconductor chips are produced with contact areas extending as far as the edges of the respective semiconductor chip. Afterward, the semiconductor chips are fixed cohesively one above another to form a stack. This compact stack of semiconductor chips can then be encapsulated with a layer made of plastic resist which is filled with nanoparticles. Finally, this outer conductive encapsulation layer is then patterned to form interconnect sections between the contact areas of semiconductor chips stacked one on top of another.

This method has the advantage that this enables the to date highest possible densification, particularly in hardware for data storage devices and data processing. In this case, it is particularly advantageous that the contact areas are no longer arranged in the edge region of a top side of a semiconductor chip, but rather extend as far as the edges of the semiconductor chip. Consequently, these edges of the contact areas, after the cohesive fixing of the semiconductor chips one above another, can be short-circuited by the encapsulating conductive layer firstly via the nanoparticles. This line can then be patterned, and all degrees of freedom of a three-dimensional wiring are available to this patterning, so that the stack of semiconductor chips may advantageously have different semiconductor chip sizes and there is no need to provide any size gradation of the kind that is a prerequisite in conventional technologies for stacking semiconductor chips in order to wire the topmost semiconductor chip with the bottommost semiconductor chip of a stack.

The application of the layer made of nanoparticle-filled plastic resist to the semiconductor stack may be effected by means of a spraying technique. Spraying techniques of this type provide for a relatively uniform application of the nanoparticle-filled plastic resist, which is then patterned to form conductor portions.

In a further preferred implementation of the method, the semiconductor stack, for encapsulation with a layer made of plastic resist, is dipped into a bath of nanoparticle-filled plastic resist. The advantage of such a dipping technique is that mass production and mass coating of the semiconductor stack become possible, but the thicknesses achieved in the process are significantly higher than in the case of the spraying technique.

For the patterning of the nanoparticle-filled plastic resist, a laser ablation method is used which on the one hand vaporizes the plastic resist and on the other hand welds the nanoparticles together to form interconnects. Where no laser removal of the plastic resist takes place, and thus where the nanoparticles are not welded together either, the nanoparticle-filled plastic resist can be stripped away or washed away by means of corresponding solvents.

In principle, it is also possible to carry out the patterning of the nanoparticle-filled layer made of plastic resist to form interconnect sections by means of the photolithography methods. By way of example, projection photolithography may be successfully employed here on account of the greatly patterned side edges of the semiconductor chips that are stacked one on top of another.

Finally, it is possible for the interconnect sections not to be attained in the form of an encapsulation and subsequent pattern of a layer, but rather to apply them selectively by means of precision injection techniques from the outset. In the case of said precision injection techniques, a few micrometers fine steel of plastic resist which is filled with nanoparticles is injected onto the edge sides of the semiconductor chip stack. The interconnect sections are thereby practically drawn on the edge sides of the semiconductor stack.

If the connection density between the stacked semiconductor chips is to be increased, then it is also possible to apply multilayer interconnect sections in alternation with insulation layers to the semiconductor stack either selectively or with the aid of the laser removal method or with the aid of photolithography for processing. With this method variant, the number of conductor portions which connect the contact areas of the individual semiconductor chips on a semiconductor chip stack can advantageously be increased as desired.

To summarize, it can be stated that the invention makes it possible to realize production of stacked semiconductor chips with the smallest possible spatial wiring and with geometry-independent chip sizes. Expensive rewiring plates between the stacked semiconductor chips are thereby avoided. Intermediate contact layers, such as flip-chip contacts or bonding wire connections, for example, also become superfluous with the present invention. To that end, the contact areas of the semiconductor chips are led outward as far as the semiconductor chip edges. This may be effected as early as at the front end or with a thin rewiring layer to be applied to the active top side of the semiconductor chips.

The semiconductor chips to be stacked are subsequently connected cohesively to one another. This may be effected by means of an adhesive bonding process or a soldering process or a diffusion soldering process. This chip composite as a semiconductor chip stack is then dipped into a solution filled with electrically conductive metallic or metallically coated nanoparticles or, as an alternative, said solution is sprayed onto the stack of semiconductor chips. Afterward, the particles can be patterned by means of laser bombardment and fused together to form interconnects. The excess particle solution that was not combined into interconnects is then removed either by being washed away or by being dipped into a suitable solvent.

Moreover, in this way multilayer rewiring structures can be produced and can be applied by additional process by introduction of corresponding insulation layers made of a dielectric. Required plated-through holes to the active top sides of the semiconductor chips can likewise be uncovered by means of laser removal and a conductive connection can subsequently be applied and patterned once again by means of a nanoparticle solution. To conclude the process, the semiconductor chip stack may also be applied to a base chip or to a corresponding carrier or be provided with external contacts on its exterior sides.

If a protective plastic cap is to be provided for the protection of the semiconductor chip stack and the contact areas, and also the rewiring having nanoparticles, it is possible to provide less expensive and higher-viscosity molding compositions than hitherto in the molding process, especially as the semiconductor chip stack forms a stable and compact semiconductor body. With this type of stacking, all wire connections are obviated. In particular, very thin housings can be realized reliably since the space requirement for wires, for bump contacts or for flip-chip contacts is obviated.

FIG. 1 illustrates a schematic cross section through a semiconductor component 14 having a semiconductor chip stack (100) of a first embodiment of the invention. The semiconductor chip stack 100 has a lower semiconductor chip 1 and an upper semiconductor chip 2 stacked thereon. The semiconductor chips 1, 2 have top sides 11, rear sides 12 and edge sides 10. In this first embodiment of the invention, the top side 11 of the lower semiconductor chip 1, which carries the active semiconductor elements of an integrated circuit, is cohesively connected to the rear side 12 of the upper semiconductor chip 2. The top sides 11 of the semiconductor chips 1 and 2 have contact areas 5 extending as far as the edges 6 of the top sides 11 of the semiconductor chips 1 and 2. Said edges which here have the contact areas 5 are called upper edges 8 hereinafter, and the edges that form between the edge sides 10 and the rear side 12 of the semiconductor chips 1 and 2 are identified as lower edges 9 hereinafter. The stack 100 of semiconductor chips 1 and 2 is covered by an insulation layer 16 on its surfaces and has windows 18 in the region of the contact areas 5, both on the edge sides 10 and on the top sides 11, so that it is possible to access said contact areas at the edges 6.

On said insulation layer 16 with windows 18 to the contact areas 5, there is applied a patterned layer 15 made of nanoparticle-filled plastic resist, which, in this embodiment of the invention, has contact windows 19 to the underside of the semiconductor stack 100, via which windows it is possible to access the electrically conductive layer 15 made of nanoparticle-filled plastic resist. A further insulation layer 17 is applied on the patterned conductive layer 15. On said second insulation layer 17, it is possible, if necessary, to apply further conductive layers 15 made of nanoparticle-filled plastic resist in alternation with insulation layers 16, 17 and it is thus possible to coat the edge sides 10, the top sides 11 and the rear sides 12 of the semiconductor chip 1 or 2 of the semiconductor chip stack 100 with a multilayer rewiring structure 23.

The electrically conductive layer 15 is patterned in such a way that conductor portions 7 are formed which, by way of example, as is illustrated in FIG. 1, can connect an external contact area 20 on the underside of the semiconductor chip stack 100 via the edge sides 10 and also the top sides 11 to the contact areas 5 on the first and second semiconductor chips. Said conductor portions arise as a result of a nanoparticle-filled plastic resist being applied to the first insulation layer 16 and being heated by means of laser removal, the resist component volatilizing, while the nanoparticles are densified to form conductor portions 7.

Conductor portions 7 of this type may extend from the underside of the semiconductor chip stack 100 as far as the top side 11 of the semiconductor chip stack 100 and in the process connect the contact areas 5 of both semiconductor chips 1, 2 to one another without requiring through-etchings through the semiconductor chips. Those regions of the nanoparticle-filled plastic resist which are not patterned to form conductor portions 7 can be dissolved in a solvent bath and removed. The laser removal makes it possible to realize corresponding conductor portions 7 both on the underside of the semiconductor chip stack 100 and on the top sides 11 of the semiconductor chips 1 and 2 of the semiconductor chip stack 100, and on the edge sides 10.

In this embodiment, the contact windows 19, on the underside of the semiconductor chip stack 100, are covered with an external contact area 20, which can carry an external contact 21, illustrated by dashed lines here. For illustrating the invention, the dimensions are not true to scale, so it is possible, by way of example, for the coating of the rear sides 12, edge sides 10 and top sides 11 of the semiconductor chip stack 100 by a system having an insulation layer 16, a conduction layer 15 and a further insulation layer 17 to have a thickness d of only a few micrometers.

The semiconductor chips have a thickness D that may be between 50 μm and 700 μm. The cohesive connecting layer 22 may have an adhesive or a soldering material having a thickness w likewise of only a few micrometers. Compared with these thickness dimensions, the area dimensions of the semiconductor chips are significantly larger and may have dimensions in the centimeters range. By contrast, the contact areas 5 on the active top sides 11 of the semiconductor chips 1 and 2 are likewise only several tens of μm in size and, on account of the conductor portions 7 made of nano-filled plastic resist according to the invention, can furthermore be reduced in size to a few micrometers squared, whereby it is possible to achieve a high density in conjunction with a small pitch or small step size between the contact areas 5.

Figure 2:
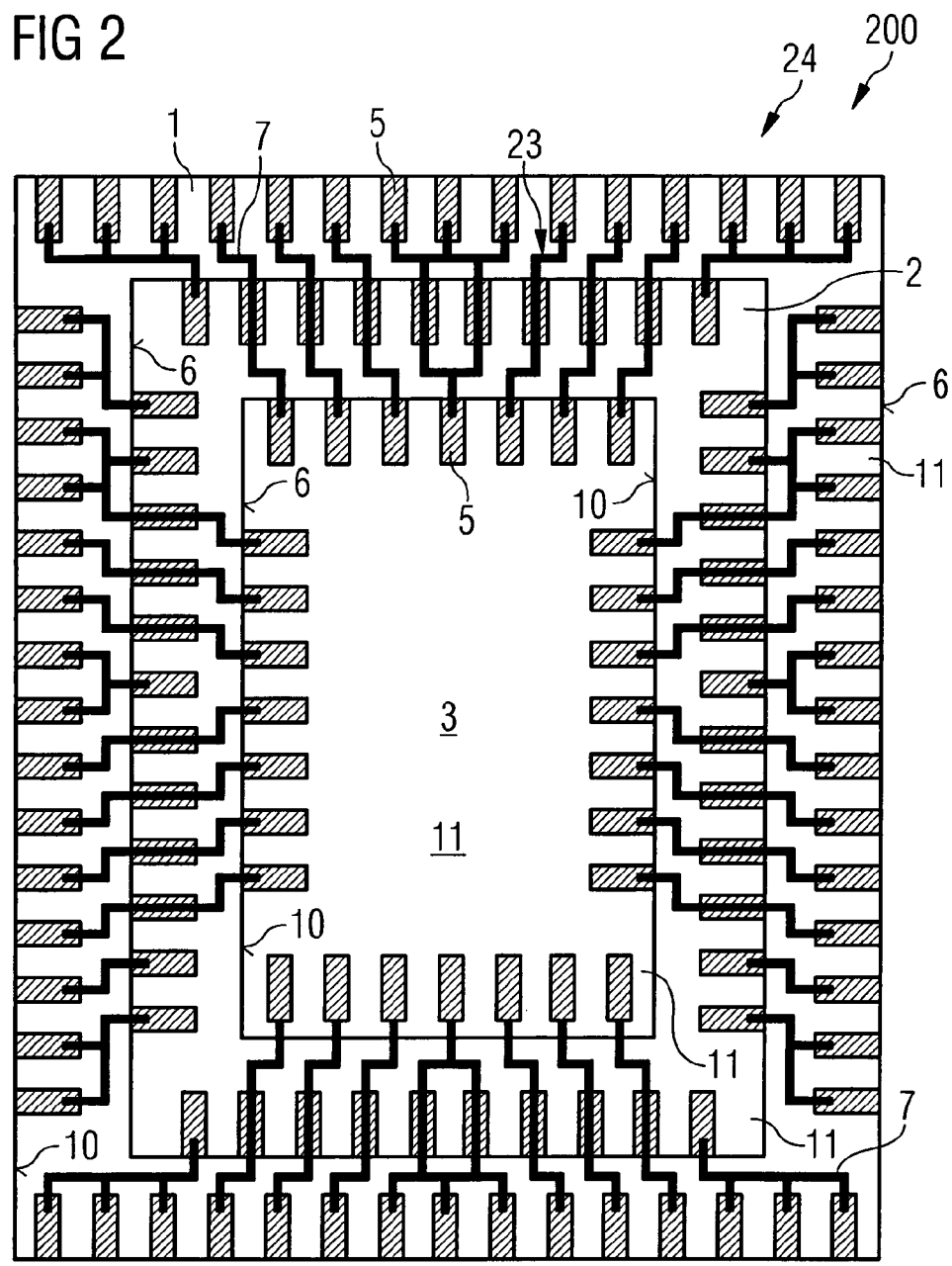
FIG. 2 illustrates a schematic plan view of a semiconductor component having a semiconductor chip stack of a second embodiment of the invention.

FIG. 2 illustrates a schematic plan view of a semiconductor component 24 having a semiconductor chip stack 200 of a second embodiment of the invention. This plan view illustrates three semiconductor chips 1, 2 and 3 stacked one on top of another. In this case, the size of the top sides 11 of the semiconductor chips 1 to 3 decreases from 1 to 3, so that the topmost semiconductor chip 3 has the smallest area and the bottommost semiconductor chip 1 has the largest area. This downwardly increasing size of the semiconductor chips 1 to 3 was chosen in this embodiment in order to illustrate the rewiring structure 23 of such a semiconductor chip stack 200 with the aid of the plan view. In this case, the conductor portions 7 run partly on the top sides 11 of the semiconductor chips and partly on the edge sides 10 of the semiconductor chips.

The contact areas 5 once again reach as far as the edges 6 in each of the semiconductor chips 1 to 3, whereby a three-dimensional wiring becomes possible. The decrease in the size of the top sides 11 of the semiconductor chips 1 to 3 from the bottommost semiconductor chip 1 to the topmost semiconductor chip 3 is not absolutely necessary in the case of the rewiring structure 23 according to the invention since the rear sides—as already illustrated in FIG. 1 with the rear side 12 of the semiconductor chip 1—of the semiconductor chips can also be provided with conductor portions 7 with the aid of the laser removal method, by way of example. This means that the semiconductor chips 1 to 3 may have, in principle, any desired size in the stacking order in this new wiring technique, as is illustrated in the subsequent figures.

Figure 3:
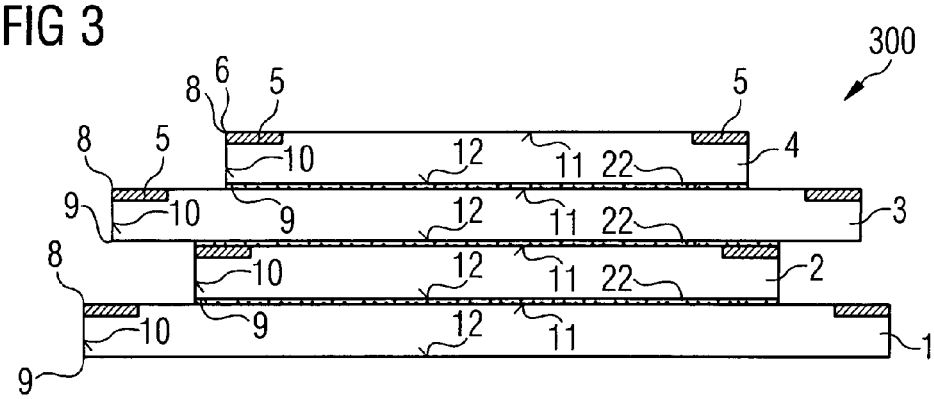
FIG. 3 illustrates a schematic cross section through four semiconductor chips stacked one on top of another for producing a semiconductor component having a semiconductor chip stack of a third embodiment of the invention.
Figure 4:
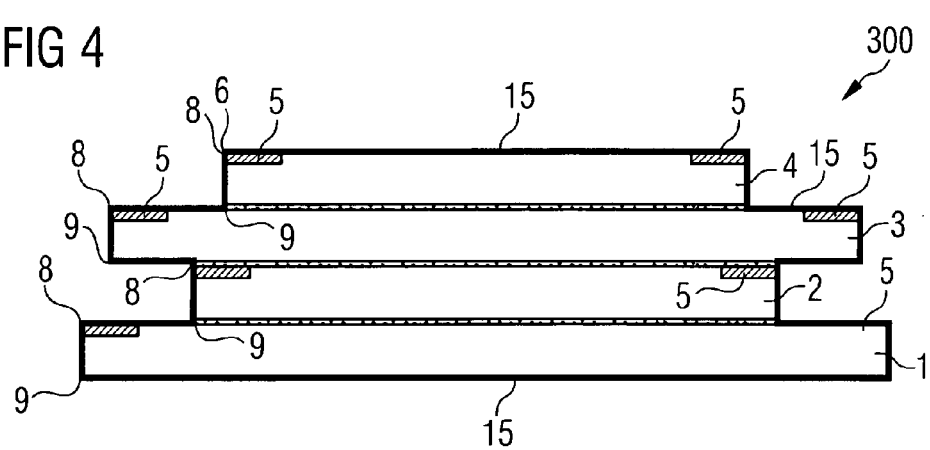
FIG. 4 illustrates the schematic cross section of the semiconductor chip stack from FIG. 3 after encapsulation of the semiconductor chip stack with a layer having nanoparticles.
Figure 5:
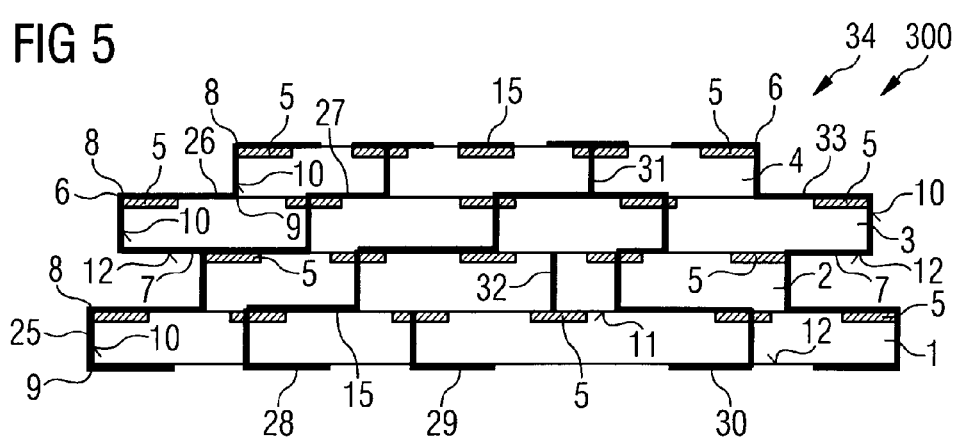
FIG. 5 illustrates a side view of the semiconductor component of the third embodiment of the invention after patterning of the layer having nanoparticles that are illustrated in FIG. 4.

FIGS. 3 to 5 illustrate stages in the production of a semiconductor component having a semiconductor chip stack of a third embodiment of the invention.

FIG. 3 illustrates in this respect a schematic cross section through four semiconductor chips 1 to 4 stacked one on top of another for producing a semiconductor component 34 having a semiconductor stack 300 of this third embodiment of the invention. Of the four semiconductor chips 1 to 4 stacked one on top of another, the bottommost semiconductor chip 1 has the largest active top side 11. The semiconductor chip 2 stacked by its rear side 12 on the semiconductor chip 1 has a smaller active top side 11 by comparison therewith, so that the third semiconductor chip 3 projects beyond the edge sides 10 of the second semiconductor chip 2. A semiconductor chip 4 having a smaller active top side 11 is in turn arranged on the third semiconductor chip 3.

The semiconductor chips 1, 2, 3 and 4 are cohesively connected by means of an adhesive via the connecting layers 22. While the contact areas 5 of the active top sides 11 of the semiconductor chips 1, 3 and 4 are freely accessible, the top side 11 of the contact areas 5 of the semiconductor chip 2 is covered, but on account of the contact areas 5 being led, according to the invention, to the edge sides 10 of the semiconductor chip 2, contact can be made with the edge sides 10 of the contact areas 5 of the semiconductor chip 2 as well.

A semiconductor chip stack 300 prepared in this way can then be covered with an electrically conductive layer.

FIG. 4 illustrates a schematic cross section of a semiconductor chip stack 300 illustrated in FIG. 3 after encapsulation of the semiconductor chip stack 300 with a layer 15 having nanoparticles. Said layer 15 having nanoparticles is sprayed onto all the exterior sides of the semiconductor chip stack 300 by a plastic resist which is filled with electrically conductive nanoparticles being sprayed on or by the semiconductor chip stack being dipped into a bath containing a plastic resist having filled nanoparticles. After drying of the resist with precuring of the resist, said layer 15 having nanoparticles can then be patterned.

FIG. 5 illustrates a side view of the semiconductor component 34 after patterning of the layer 15 having nanoparticles in accordance with FIG. 4. The patterning of the semiconductor chip stack 300 to form a semiconductor component 34 was achieved in the third embodiment of the invention by guiding a laser beam along the tracks that are marked black in FIG. 5. In the process, the nanoparticles are contacted with one another through to welding, while the plastic resist simultaneously evaporates. Interconnects 25 to 33 arise in the process, as illustrated in the side view of FIG. 5, which interconnects, with different interconnect routing, interconnect or connect the different contact areas 5 of the semiconductor chips 1 to 4 to one another. The contact areas 5 of the second semiconductor chip 2 of the semiconductor chip stack 300 are contact-connected on their edge sides 10 during the patterning, especially as the semiconductor chip 2, as is illustrated in FIG. 4, is smaller than the semiconductor chip 3 arranged above it. The rewiring technique according to the invention is thus able also to create electrical connections to contact areas 5 which have only their cross section available for the electrical connection to an interconnect 7. The interconnects 7 on the rear side 12 of the semiconductor chip 3 are realized by means of a deflection optic for a laser during this stacking of the semiconductor chips 1 to 4.

With this technique it is possible to realize a wide variety of structures, as is illustrated with the various interconnects 25 to 33 illustrated here. Thus, the interconnects can branch, as is illustrated with the interconnects 25, 26 and 27, or they are led together, as illustrated by the interconnects 28, 30 and 31. Alternatively, they merely serve to produce a connection between a plurality of semiconductor chips 1 to 4, as is illustrated for example by the interconnects 29, 32 and 33 in this side view. Such a simple wiring pattern which can be produced by means of relatively inexpensive fabrication methods is only possible by virtue of the fact that firstly a plastic resist having nanoparticles is used and secondly the contact areas of the individual semiconductor chips 1 to 4 are led as far as the edges of the respective semiconductor chip 1 to 4.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method for producing a semiconductor component comprising a stack of semiconductor chips, the method comprising:
    producing semiconductor chips with contact areas extending as far as the edges of the semiconductor chip;
    cohesively fixing the semiconductor chips one above another to form a semiconductor stack;
    encapsulating the semiconductor stack with a layer made of a plastic resist which is filled with nanoparticles; and
    patterning the layer to form interconnect sections between the contact areas of the semiconductor chips stacked one on top of another.

2. The method as claimed in claim 1, comprising spraying on the layer made of plastic resist for encapsulating the semiconductor stack.

3. The method as claimed in claim 1, comprising dipping the semiconductor stack, for encapsulation with a layer made of plastic resist, into a bath of nanoparticle-filled plastic resist.

4. The method as claimed in claim 1, comprising effecting a laser removal method for patterning the nanoparticle-filled plastic resist to form interconnect sections.

5. The method as claimed in claim 1, comprising carrying out a photolithography method for patterning the nanoparticle-filled layer made of plastic resist to form interconnect sections.

6. The method as claimed in claim 1, comprising applying the interconnect sections to the semiconductor stack selectively by precision injection techniques.

7. The method as claimed in claim 1, comprising applying multilayer interconnect sections in alternation with insulation layers to the semiconductor stack.

* * * * *